350-276
3/22/77    XR    4,013,465    SR

United States Patent [19]
Clapham et al.

[11] 4,013,465
[45] Mar. 22, 1977

[54] REDUCING THE REFLECTANCE OF SURFACES TO RADIATION

[75] Inventors: Peter Brian Clapham, Chertsey; Michael Christopher Hutley, Hanworth, both of England

[73] Assignee: Secretary of State for Defence in Her Britannic Majesty's Government of the United Kingdom of Great Britain and Northern Ireland, London, England

[22] Filed: Feb. 9, 1976

[21] Appl. No.: 656,757

Related U.S. Application Data

[63] Continuation of Ser. No. 467,354, May 6, 1974, abandoned.

[52] U.S. Cl. .................... 96/36; 96/27 R; 96/383; 96/79; 96/84 R; 350/276 R
[51] Int. Cl.$^2$ .................... G03C 5/00; G03C 5/04
[58] Field of Search .......... 96/35.1, 36, 38.3, 27 H, 96/27 R, 79, 84; 350/3.5, 162 R, 160 R, 276 R

[56] References Cited
UNITED STATES PATENTS

| | | | |
|---|---|---|---|
| 3,622,319 | 11/1971 | Sharp | 96/38.3 |
| 3,623,798 | 11/1971 | Sheridan | 350/3.5 |
| 3,698,928 | 10/1972 | Blome | 350/276 R |
| 3,718,078 | 2/1973 | Plummer | 350/276 R UX |
| 3,728,117 | 4/1973 | Heidenhain et al. | 96/36 |
| 3,732,363 | 5/1973 | Glenn | 96/79 UX |
| 3,733,258 | 5/1973 | Hanak et al. | 204/192 |
| 3,777,633 | 12/1973 | Kirk | 96/38.3 |
| 3,815,969 | 6/1974 | Fletcher et al. | 96/79 X |
| 3,909,111 | 9/1975 | Meyerhofer | 96/38.3 X |
| 3,940,511 | 2/1976 | Deal et al. | 350/276 R X |

*Primary Examiner*—Edward C. Kimlin
*Attorney, Agent, or Firm*—Pollock, VandeSande & Priddy

[57] ABSTRACT

A method of producing a surface having a reduced reflectance to electromagnetic radiation in a predetermined wavelength band which comprises arranging on the surface a regular array of protuberances having a height which is not less than one third of the length of the longest wavelength in the band and at a spacing which is less than the length of the shortest wavelength of the band divided by the refractive index of the material of which the protuberances consist.

16 Claims, 6 Drawing Figures

REDUCING THE REFLECTANCE OF SURFACES TO RADIATION

This is a continuation of application Ser. No. 467,354, filed May 6, 1974, now abandoned.

This invention relates to surfaces having reduced reflectance to electromagnetic radiation, that is to say surfaces having a reflectance definitely and purposefully less than the reflectance of normal and conventional types of surfaces made of the same material, at least for a predetermined band of electromagnetic radiation, as a result of the initial manner of forming the surface or of a subsequent treatment of an existing surface.

The passage of radiation from one medium to another is accompanied by the reflection of a portion of the incident radiation at the interface between media. If the radiation is to be utilized, as in most optical equipment, such reflection constitutes an energy loss and a reduction in the efficiency of eventual utilization of the radiation. This loss is most commonly of importance in optical instruments of all kinds in relation to the passage of light between air and a transparent solid medium such as glass or a plastics substance.

It has been usual to reduce the reflection at an interface between such media by depositing on the surface of the solid medium a very thin transparent coating of one or more substances, commonly metallic halides, having a refractive index intermediate between that of air and the solid. The process often called blooming when applied to optical elements, tends to be expensive, requiring very careful control and inspection of coating thickness and uniformity.

The present invention provides an alternative method of providing reduced reflectance, at an interface which may be made effective over a chosen part of a wider range of wavelengths than has commonly been possible hitherto and without very stringent requirements for control and inspection.

According to the invention, a surface having a reduced reflectance to electromagnetic radiation in a predetermined wavelength band, in or for any article of manufacture, comprises a regular array of protuberances having a height which is not less than one third of the length of the longest wavelength in the band and at a spacing which is less than the length of the shortest wavelength of the band divided by the refractive index of the material of which the protuberances consist.

In particular, an optical light transmitting element, for example, a lens, in or for an optical instrument, is provided with a surface having a reduced reflectance to electromagnetic radiation in the visible waveband with a regular array of protuberances as above defined.

Optionally a method of providing the desired surface comprises applying to a base surface a layer of photosensitive material, exposing that material to a regular pattern of electromagnetic radiation to which it is sensitive and developing the photosensitive material, whereby the topography of the surface of the developed material is related to the pattern of light, so that reflection of visible radiation by the surface is reduced.

The method may further comprise, after exposure to the regular pattern of light and developing the photosensitive material, exposing the layer of developed material and the surface under it to a process of erosion whereby the topography of the surface is related to the pattern of light.

The process of erosion may, for example, be an etching process or a process of ion beam erosion.

The regular pattern of light may comprise a set of straight line interference fringes on the layer of photosensitive material; or optionally may comprise two sets of straight line interference fringes arranged at an angle preferably in the range of about 20° to about 90° to each other on the layer of photosensitive material; any set of fringes desirably being produced by the intersection of two coherent beams of radiation derived from a laser.

According to one optional feature the photosensitive material is arranged when developed to swell to form an array at protuberances, while according to an alternative feature the photosensitive material is photoresist, parts of which are dissolved away in the photographic process of development to leave an array of protuberances.

The invention extends to any article the reflectance of any surface of which has been reduced according to any method aforesaid. Optionally the refractive index of the material of the protuberances is equal to the refractive index of the material of such surface. According to another optional feature the surface may be advantageously applied to an absorbing element which is opaque to radiation in the predetermined waveband, or alternatively the article may be an optical lens as previously mentioned. According to a further optional feature the surface and array of protuberances may be coated with a thin film of metal, desirably gold, whereby the reflectance of the surface to visible wavelengths is reduced relative to the reflectance to infrared wavelengths. Coatings of other metals, for example, aluminum, may be applied by vacuum deposition. Metal surfaces having reduced reflectance may of course be produced by any desired manner in accordance with the invention.

The invention will now be described by way of example only with reference to the accompanying drawings in which.

Figure 1A:
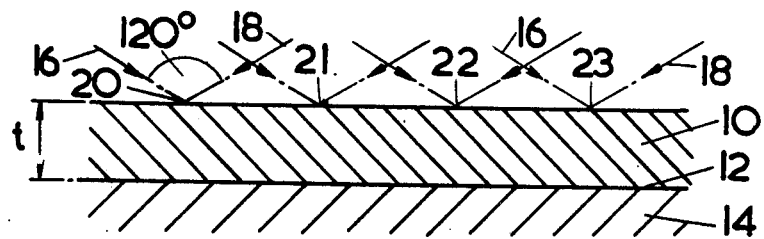
FIGS. 1a and 1b illustrate a section through a surface before and after development.
Figure 1B:
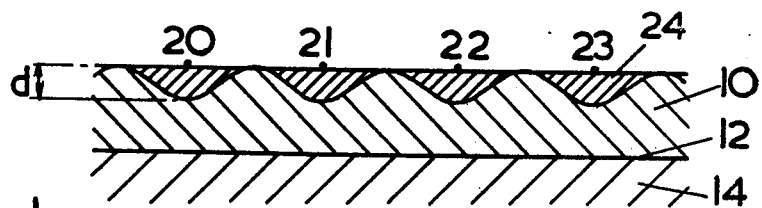
Figure 5:
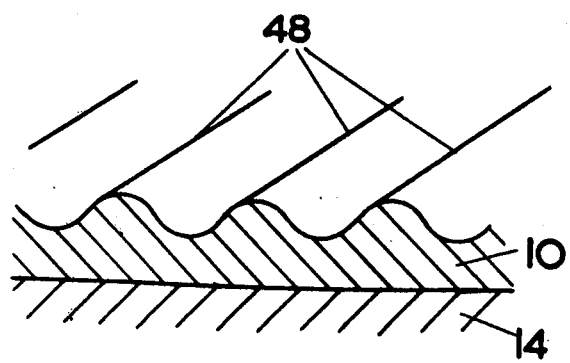

FIG. 5 illustrates diagrammatically an alternative kind of surface after development In FIG. 1a, positive photoresist is applied by any of the usual techniques to form an even layer 10 of thickness $t$ on the surface 12 of a glass substrate 14. Two collimated beams of light 16, 18 derived from a krypton laser (not shown) of wavelength 351 nm are directed onto the layer 10 where straight line interference fringes are formed with maxima at positions indicated by references 20, 21, 22 and 23. The included angle between the beams 16, 18 is 120° so that the positions 20 to 23 are each about 210 nm apart. The photoresist is developed by the normal technique and as shown in FIG. 1b material 24 around points 20 to 23 is dissolved away leaving the surface of the photoresist with a substantially sinusoidal profile i.e. a corrugated or ridged surface with depth $d$.

Figure 2:
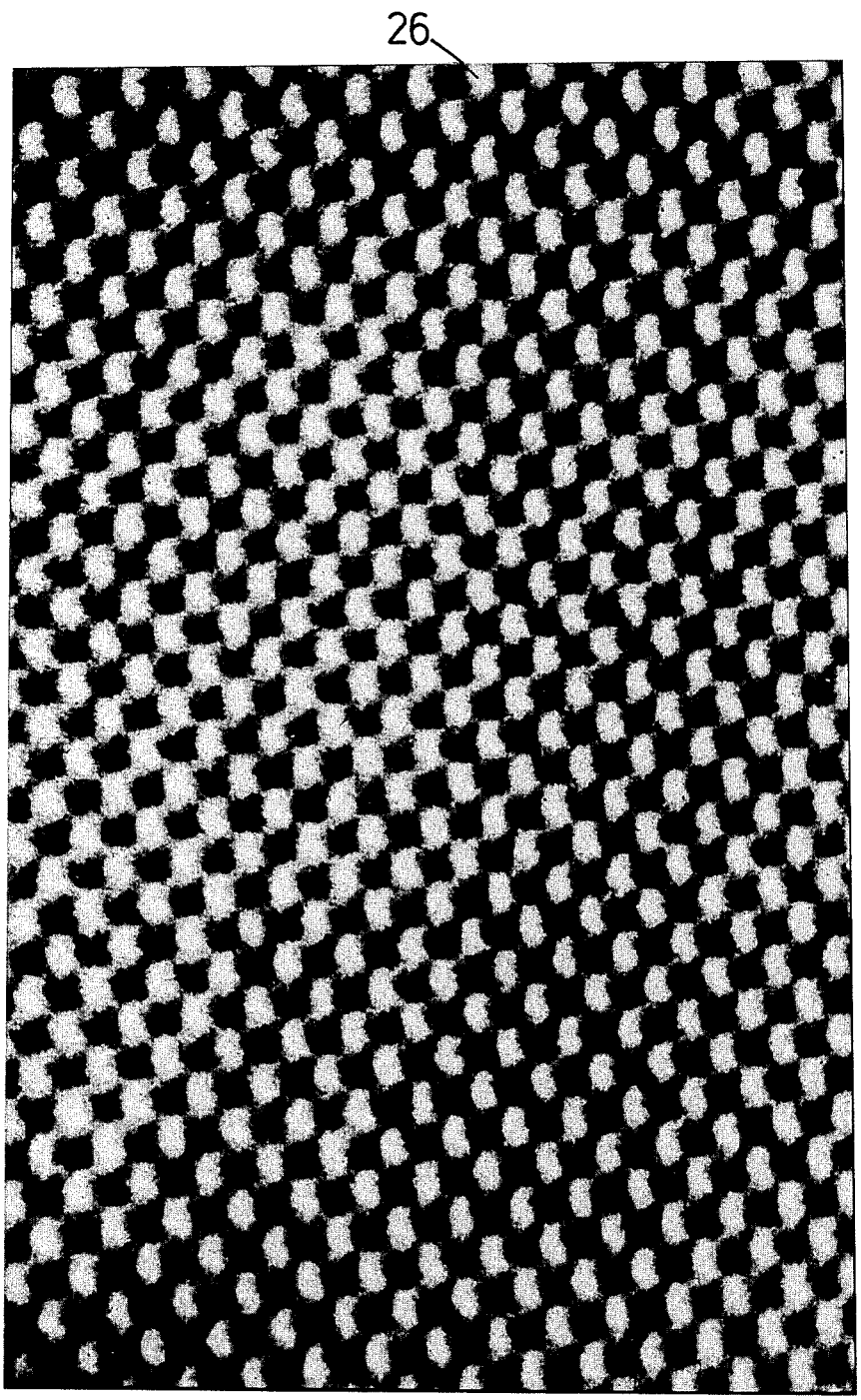
FIG. 2 illustrates in perspective a surface to which the method of the invention has been applied.

Optionally before development, the substrate 14 and layer 10 are rotated through 90° so that the straight line interference fringes are formed on the layer at right angles to their position during the first exposure, and the second exposure is of equal length to the first, then after development two sets of corrugations or ridges will occur in the layer 10 and the remaining photoresist will form a regular array of protuberances 26 as shown in FIG. 2.

Figure 3:
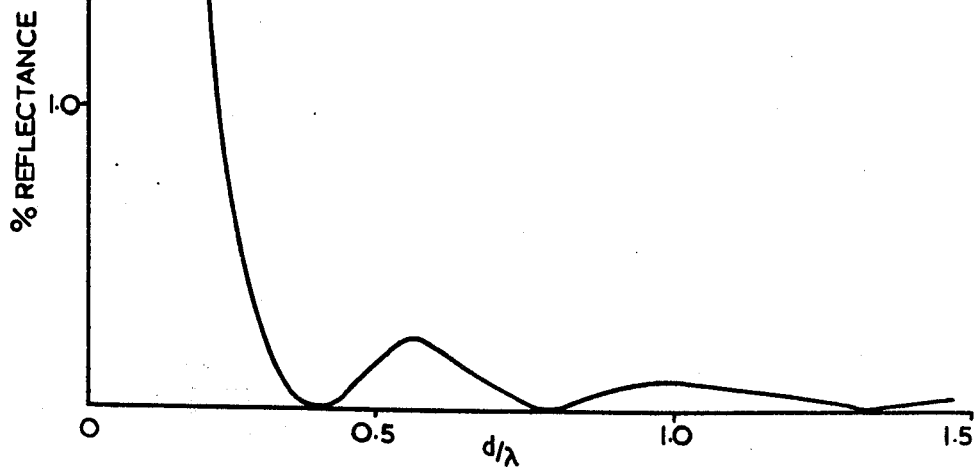
FIG. 3 illustrates the computed dependence on reflectance on wavelength and on the height of the protuberances.

In FIG. 3 the typical percentage reflectance is plotted against the height $d$ of the protuberances 26 divided by wavelength $\lambda$. It can be seen that when $d<<\lambda$ the interface at surface 12 appears to be relatively sharp, and the reflectance is essentially that of a discontinuous boundary i.e. very high. As $d/\lambda$ increases the reflectance falls to a minimum at $d/\lambda \cong 0.4$ then shows a series of maxima and minima, the maxima being considerably less than the reflectance of a sharp interface.

For optimum performance at visible wavelengths, $d$ is preferably 250 nm or more. The spacing between protuberances must be sufficiently small to avoid losses by diffraction, i.e. less than the shortest wavelength divided by the refractive index of the glass substrate 14, that is about 200 to 250 nm.

Figure 4:
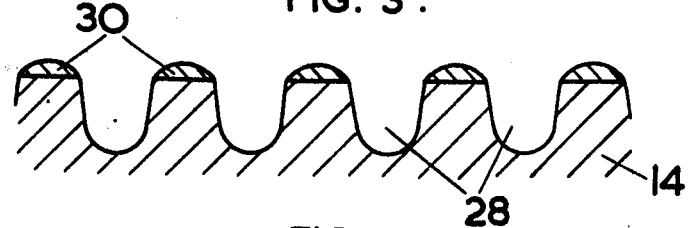
FIG. 4 illustrates a surface after application thereto of ion beam erosion.

FIG. 4 shows a surface after application of the method of the invention followed by ion beam erosion. The beam erodes the photoresist and reaches the surface of the substrate which is also eroded to form corrugations 28, between remaining areas 30 of photoresist. The corrugations in the substrate may be deeper than the corresponding corrugations in the photoresist before exposure to the ion beam. Use of such a method may provide a surface having a regular array of protuberances which will withstand harder wear than a layer of photoresist alone.

The protuberances have been described as being substantially in the form of truncated cones as shown in FIG. 4; but they may be in the form of ridges 48 as shown in FIG. 5. In the latter case the ridges have the same height $d$ and spacing as indicated above for a required wavelength range, but the method of making requires only a single exposure to a system of straight line interference fringes to produce the required topography of surface.

What I claim is:

1. A photo-exposure method for reducing the reflectance of a surface to electromagnetic radiation in a predetermined wavelength band which comprises applying a layer of photosensitive material to said surface, exposing the photosensitive layer to a regular pattern of light to which it is sensitive, and processing the exposed photosensitive layer to convert the effect of said light pattern on said photosensitive layer into a regular array of protuberances on said surface having a height which is not less than one third of the length of the longest wavelength in the band and at a spacing between adjacent protuberances which is less than the length of the shortest wavelength of the band divided by the refractive index of the material of which the protuberances consist.

2. A method according to claim 1 wherein said electromagnetic radiation is visible radiation and said surface is the surface of an optical component, said regular pattern of light including dark interference fringes, said processing step comprising developing the photosensitive material following said exposing step to cause the topography of the surface of the developed material to be related to the pattern of light through a difference in surface level between the portions of said photosensitive material which are exposed to higher and to lower intensity of light in said pattern respectively.

3. A method according to claim 2 for reducing the reflection of visible radiation by the surface of an optical component which includes the step, following said developing step, of exposing the layer of developed material and the surface under it to a process of erosion whereby the topography of the surface is related to the pattern of light through preferential erosion of the surface in locations where the developing step has reduced the thickness of said material.

4. A method according to claim 3 in which the process of erosion is an etching process.

5. A method according to claim 3 in which the process of erosion is a process of ion beam erosion.

6. A method according to claim 2 in which the regular pattern of light comprises a set of straight line interference fringes on the layer of photosensitive material.

7. A method according to claim 2 in which the regular pattern of light comprises two sets of straight line interference fringes arranged at an angle, in the range of about 20° to about 90° to each other on the layer of photosensitive material.

8. A method according to claim 7 in which each set of interference fringes is produced by the intersection of two coherent beams of radiation derived from a laser.

9. A method according to claim 2 in which the photosensitive material is photoresist, parts of which are dissolved away in the photographic process of development to leave said array of protuberances.

10. An article having a surface with a reduced reflectance produced in accordance with the method of claim 1.

11. An article which has a regular array of protuberances produced on a surface by a method according to claim 2.

12. An article according to claim 10 in which the refractive index of the material of the protuberances is equal to the refractive index of the material of the surface.

13. An article according to claim 10 in which the surface is opaque to radiation in the predetermined wavelength band.

14. An article according to claim 10 which is an optical lens.

15. An article according to claim 10 in which the surface and array of protuberances are coated with a thin film of metal whereby the reflectance of the surface to visible wavelengths is reduced relative to the reflectance to infra-red wavelengths.

16. An article according to claim 15 in which the metal is gold.

* * * * *

UNITED STATES PATENT AND TRADEMARK OFFICE
CERTIFICATE OF CORRECTION

PATENT NO. : 4,013,465
DATED : March 22, 1977
INVENTOR(S) : Peter Brian Clapham and Michael Christopher Hutley It is certified that error appears in the above-identified patent and that said Letters Patent are hereby corrected as shown below:

In the Heading:

Please change the assignee to read: -- Secretary of State for Industry in Her Britannic Majesty's Government of the United Kingdom of Great Britain and Northern Ireland --

In the Specification:

Column 2 line 45 change "on" to -- of --

Signed and Sealed this twenty-sixth Day of July 1977

[SEAL]

Attest:

RUTH C. MASON
*Attesting Officer*

C. MARSHALL DANN
*Commissioner of Patents and Trademarks*